(12) United States Patent
Rhodes

(10) Patent No.: US 7,875,913 B2
(45) Date of Patent: Jan. 25, 2011

(54) TRANSISTOR WITH CONTACT OVER GATE ACTIVE AREA

(75) Inventor: Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 203 days.

(21) Appl. No.: 12/130,795

(22) Filed: May 30, 2008

(65) Prior Publication Data

US 2009/0294858 A1 Dec. 3, 2009

(51) Int. Cl.
 *H01L 29/76* (2006.01)
(52) U.S. Cl. ............................................. 257/288
(58) Field of Classification Search ................ None
 See application file for complete search history.

(56) References Cited

U.S. PATENT DOCUMENTS

| 5,936,271 | A | * | 8/1999 | Alsmeier et al. | ............ 257/301 |
| 6,060,765 | A | | 5/2000 | Maeda | |
| 6,686,247 | B1 | | 2/2004 | Bohr | |
| 6,902,969 | B2 | * | 6/2005 | Adetutu et al. | ............... 438/199 |
| 7,015,087 | B2 | * | 3/2006 | Kim et al. | ................... 438/238 |
| 7,224,009 | B2 | | 5/2007 | Rhodes | |
| 7,250,647 | B2 | | 7/2007 | Rhodes | |
| 7,344,985 | B2 | * | 3/2008 | Chen et al. | .................. 438/682 |
| 7,361,534 | B2 | * | 4/2008 | Pelella | ...................... 438/152 |
| 2007/0111495 | A1 | | 5/2007 | Hwang | |
| 2008/0029900 | A1 | | 2/2008 | Fukui | |

OTHER PUBLICATIONS

PCT/US2009/043385, PCT International Search Report and Written Opinion of the International Searching Authority, mailed Aug. 18, 2009, 13 pages.

* cited by examiner

*Primary Examiner*—Scott B Geyer
(74) *Attorney, Agent, or Firm*—Blakely Sokoloff Taylor & Zafman LLP

(57) ABSTRACT

A transistor contact over a gate active area includes a transistor gate formed on a substrate of an integrated circuit. A gate insulator is formed beneath the transistor gate and helps define an active area for the transistor gate. An insulating layer is formed over the transistor gate. A metal contact plug is formed within a portion of the insulating layer that lies over the active area such that the metal contact plug forms an electrical contact with the transistor gate.

13 Claims, 8 Drawing Sheets

TRANSISTOR WITH CONTACT OVER GATE ACTIVE AREA

This disclosure relates generally to integrated circuits, and more particularly, but not exclusively, relates to contacts for integrated circuits.

BACKGROUND INFORMATION

Integrated circuits have been developed to reduce the size of components used to implement circuitry. For example, integrated circuits have been using ever-smaller design features, which reduces the area used to implement the circuitry, such that design features are now well under the wavelengths of visible light. With the increasing costs of integrated circuit production equipment, designers typically seek to efficiently maximize the use of the area in a silicon substrate in which the integrated circuit is implemented. Thus, efficient layouts can reduce the cost of the integrated circuits used to implement a circuit design.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

DETAILED DESCRIPTION

Figure 1:
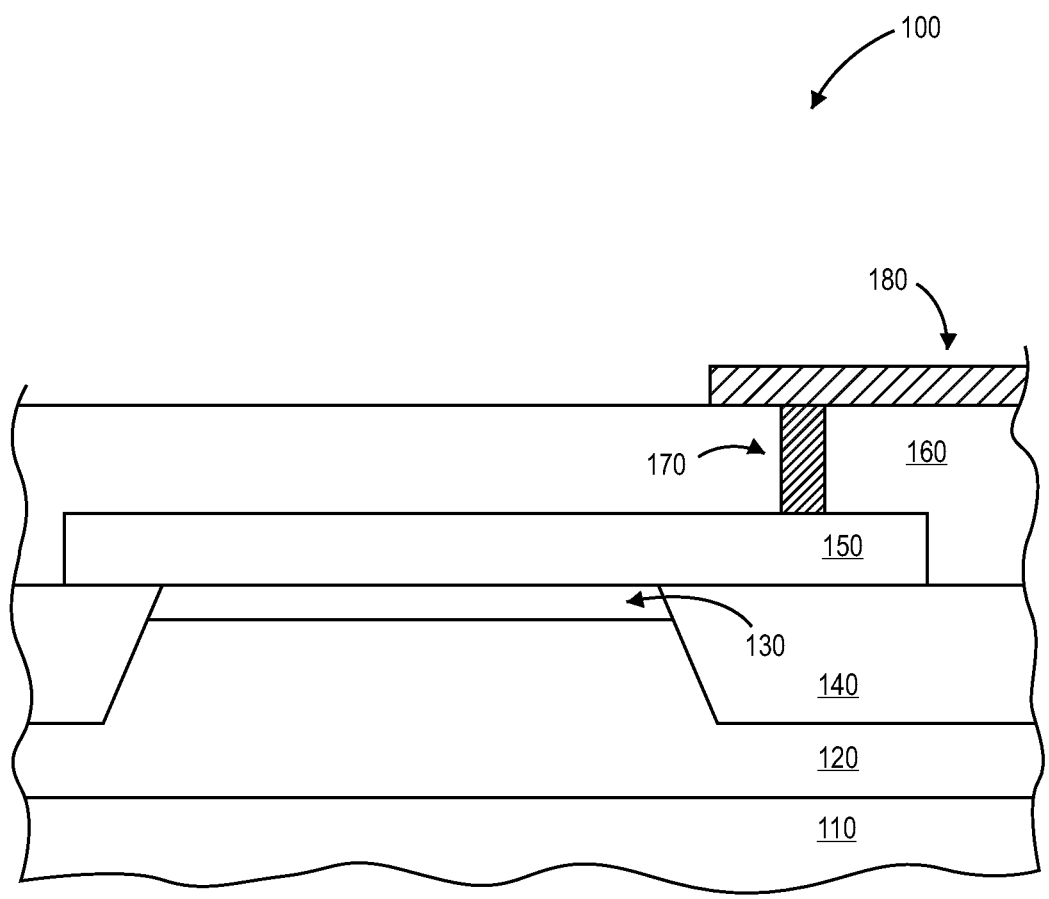
FIG. 1 is an illustration of a cross-section of a conventional transistor structure that is implemented on the substrate of an integrated circuit.

Embodiments of a transistor having a contact over a gate active area are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

In general, integrated circuits comprise circuitry that is employed for a variety of applications. The applications use a wide variety of devices such as logic devices, imagers (including CMOS and CCD imagers), and memory (such as DRAM and NOR- and NAND-based flash memory devices). These devices normally employ transistors for a variety of functions, including switching and amplification of signals.

Transistors are typically formed in integrated circuits by photolithographic processes that are performed on a silicon substrate. The processes include steps such as applying a photographic resist layer to the substrate, exposing the resist layer to a pattern using light (including deep ultra-violet wavelengths), removing the exposed portions (or non-exposed portions depending on photo-positive or photo-negative resists are used) of the resist by etching, and modifying the exposed structure, for example, by depositing or implanting additional materials to form various structure for electronic components (including transistors).

The term "substrate" includes substrates formed using semiconductors based upon silicon, silicon-germanium, germanium, gallium arsenide, and the like. The term substrate may also refer to previous process steps that have been performed upon the substrate to form regions and/or junctions in the substrate. The term substrate can also include various technologies, such as doped and undoped semiconductors, epitaxial layers of silicon, and other semiconductor structures formed upon of the substrate.

Chemical-mechanical planarization (CMP) can be performed to render the surface of the modified substrate suitable for forming additional structures. The additional structures can be added to the substrate by performing additional processing steps, such as those listed above.

FIG. 1 is an illustration of a cross-section of a conventional transistor structure that is implemented on the substrate of an integrated circuit. Structure 100 includes a substrate 110 upon which a doped layer 120 is formed. Doped layer 120 is normally formed having a conductivity type (such as an N-type). A gate oxide layer 130 is formed on a region of doped layer 120.

Insulating structures 140 are formed adjacent to gate oxide layer 130. Insulating structures 140 can be formed using processes such as shallow trench isolation (STI) or local oxidation of silicon (LOCOS). An insulating structure 140 using an STI process can be formed by etching a void within doped layer 120 and depositing a dielectric material (such as silicon dioxide) within the void. The deposited dielectric material can be planarized using CMP.

Transistor gate 150 is typically composed of polysilicon and is formed over regions of the gate oxide layer 130 and insulating structure 140. An insulating layer 160 is formed over the transistor gate 150 and regions of the insulating structure 140. Metal contact 170 can be formed within insulating layer 160 by etching a cavity and filling the cavity with a metal. A metallization layer 180 can be formed over the metal contact 170 and portions of insulating layer 160 such that electrical connections can be made between the transistor gate 150 and other devices formed within and upon substrate 110.

The metal contact 170 is normally formed over a region of the transistor gate 150 that does not directly lie over the gate oxide layer 130. The metal contact 170 is not normally formed directly over a region of the gate oxide layer 130 because the etching process used to form the cavity for the metal contact 170 connection can etch through the transistor gate 150 (which typically is composed of polysilicon).

When the transistor gate 150 is etched-through, the metal (such as Ti) that fills metal contact 170 can result in defects such as by providing an electrical short to the underlying active area that is associated with gate oxide layer 130. The source and drain (not shown) of the transistor are disposed along an axis that is at right angles to the face of the cross-section shown in the figure. The term "active area" includes the meaning of being the area (typically between the source and drain and under the gate) in which transconductance occurs, even when no such transconductance is present (such as when the circuit is not powered up).

Additionally, the metal that fills metal contact 170 can diffuse to the interface between gate oxide layer 130 and transistor gate 150. The diffusion of the metal material into the interface typically causes work function changes that alter the voltage threshold of the transistor.

As disclosed herein, a transistor contact over a gate active area includes a transistor gate formed on a substrate of an integrated circuit. A gate insulator is formed beneath the transistor gate and helps define an active area for the transistor gate. An insulating layer is formed over the transistor gate. A metal contact plug is formed within a portion of the insulating layer that lies over the active area such that the metal contact plug forms an electrical contact with the transistor gate. The metal contact plug can be formed at least partly above a region of the remaining portion of the gate oxide layer that lies between a first isolation region and a second isolation region.

Figure 2:
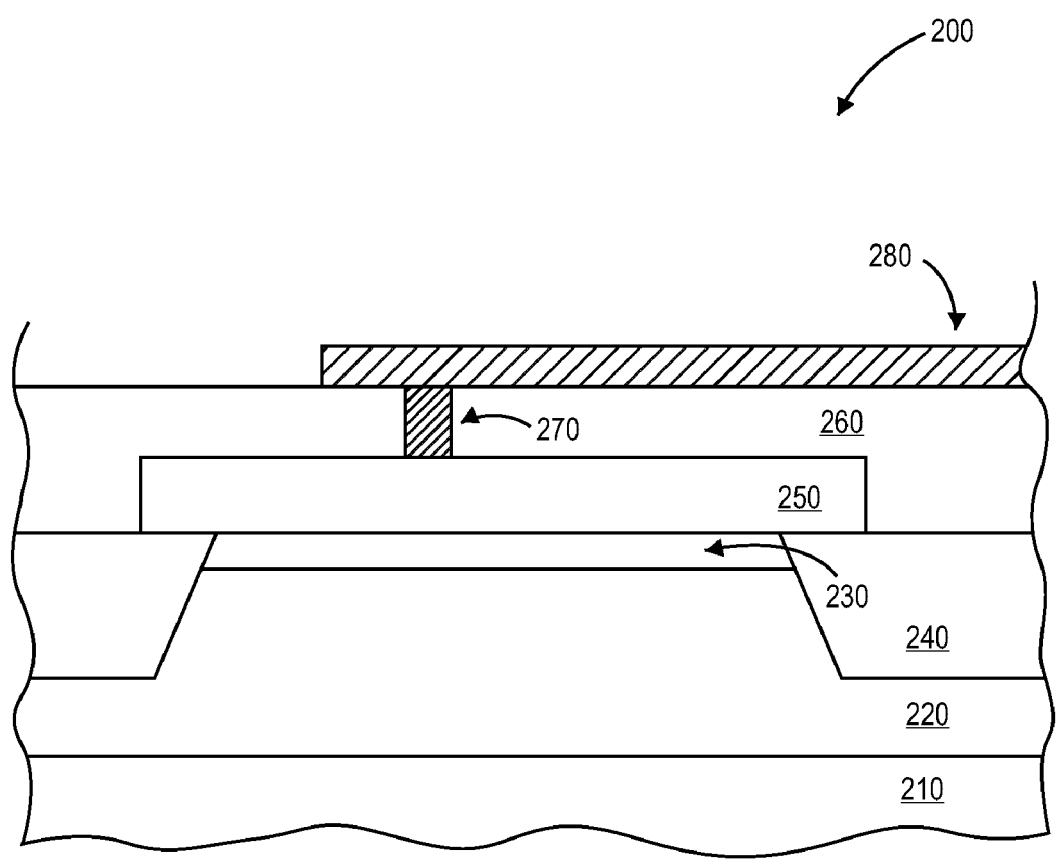
FIG. 2 is an illustration of a cross-section of a sample transistor structure that is implemented on the substrate of an integrated circuit.

FIG. 2 is an illustration of a cross-section of a sample transistor structure that is implemented on the substrate of an integrated circuit. Structure 200 includes a substrate 210 upon which a doped layer 220 is formed (such as an N-type). Doped layer 220 is normally formed having a first conductivity type. A gate oxide layer 230 is formed on a region of doped layer 220. A source and drain (not shown) are normally formed using material having a second conductivity type.

Insulating structures 240 are formed adjacent to gate oxide layer 230. Insulating structures 240 can be formed using processes such as shallow trench isolation (STI) or local oxidation of silicon (LOCOS). An insulating structure 240 using an STI process can be formed by etching a void within doped layer 220 and depositing a dielectric material (such as silicon dioxide) within the void. The deposited dielectric material can be planarized using CMP.

Transistor gate 250 is typically composed of polysilicon and is formed over regions of the gate oxide layer 230 and insulating structure 240. An insulating layer 260 is formed over the transistor gate 250 and regions of the insulating structure 240. Metal contact 270 can be formed within insulating layer 260 by etching a cavity and filling the cavity with a metal. A metalization layer 280 can be formed over the metal contact 270 and portions of insulating layer 260 such that electrical connections can be made between the transistor gate 250 and other devices formed within and upon substrate 210.

The metal contact 270 is normally formed over a region of the transistor gave 250 that lies over the gate oxide layer 230. The metal contact 270 is formed directly over at least a portion of the gate oxide layer 230. Forming the metal contact 270 over at least a portion of the gate oxide layer 230 allows the size of the transistor (of the transistor gate 250) to be reduced because the extension of the transistor gate over an insulating structure is reduced. The reduction of the transistor size allows transistors to be packed more densely within a substrate.

Figure 3:
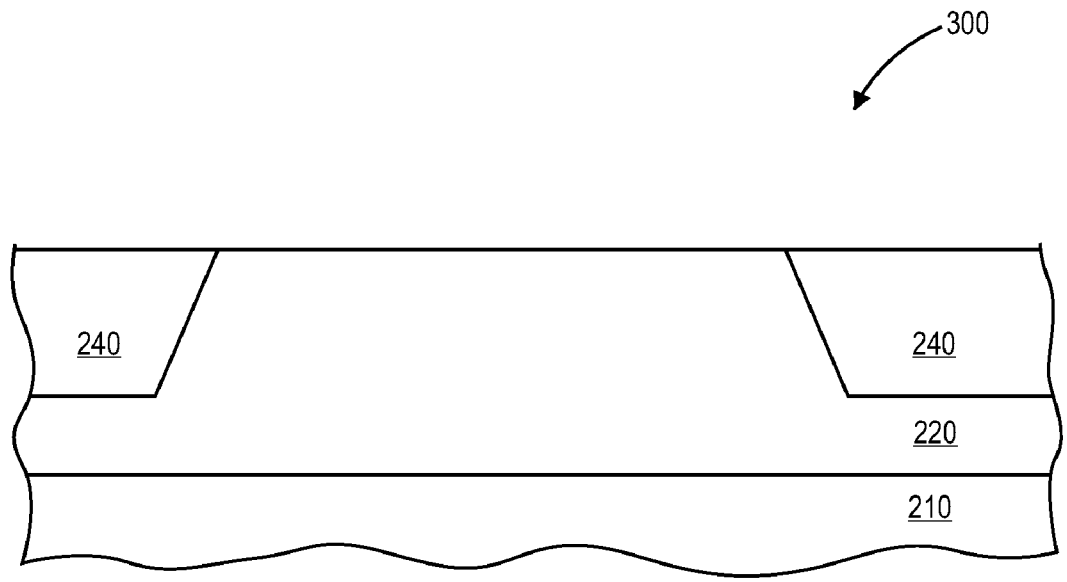
FIG. 3 illustrates a sample process for forming insulation regions that border an active area for a transistor.

FIGS. 3-9 (described below) illustrate a sample process for implementing a transistor contact over the active region. FIG. 3 illustrates a sample process for forming insulation regions that border an active area for a transistor. Structure 300 includes a substrate 210 upon which a doped layer 220 is formed. Doped layer 220 is normally formed having a first conductivity type. For example, the first conductivity type can be an N-type, and the second connectivity type can be a P-type. Doped layer 220 can be, for example, a P-well formed in the substrate. Various levels of dopant implantations can be applied to form various structures and/or adjust transistor voltage thresholds.

Insulating structures 240 can be formed in the doped layer 220 of structure 300. Insulating structures 240 can be formed by thermal oxidation of the substrate using shallow trench isolation (STI) or local oxidation of silicon (LOCOS) processes. The processes typically involve the chemical vapor deposition of an oxide material. The insulating structures can be used to form an isolation barrier around the active area for a transistor. The deposited oxide material can be planarized using CMP.

Figure 4:
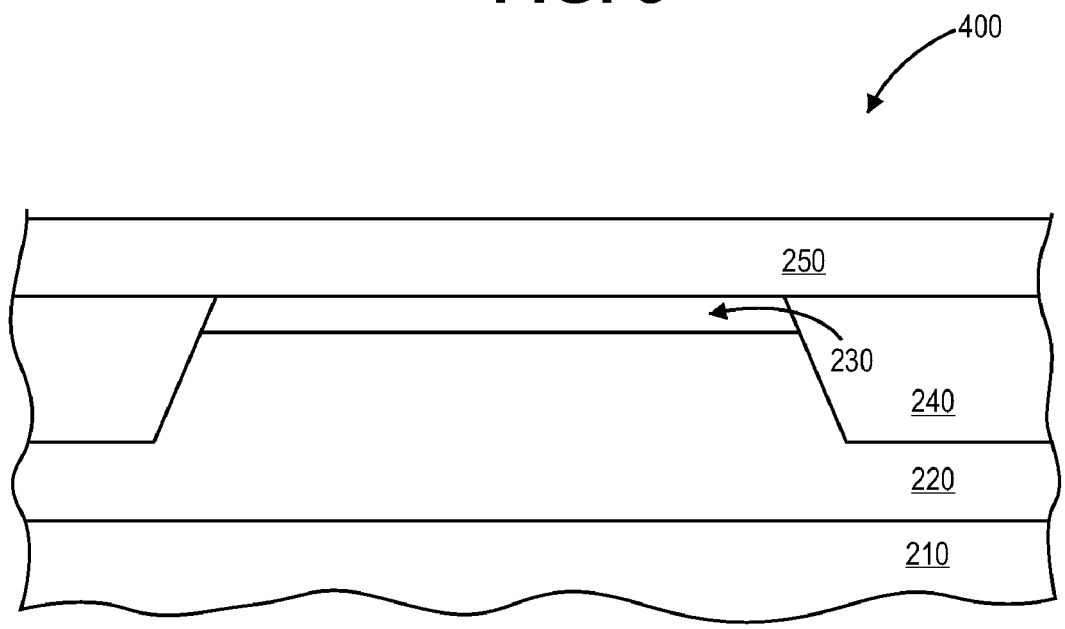
FIG. 4 illustrates a sample process for forming a gate oxide and depositing a layer of polysilicon for a transistor.

FIG. 4 illustrates a sample process for forming a gate oxide and depositing a layer of polysilicon for a transistor. Gate oxide layer 230 can be formed by growing a film of silicon dioxide of the surface of doped layer 220. A doped polysilicon layer 250 can be deposited on the surface of structure 400.

Figure 5A:
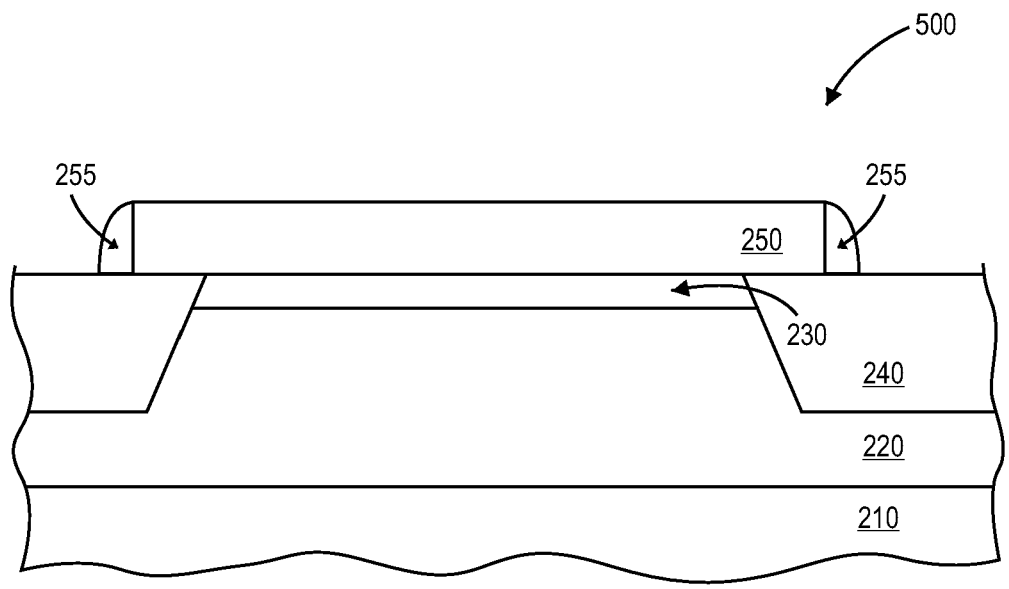
FIG. 5a illustrates a sample process for depositing a gate for a transistor.

FIG. 5a illustrates a sample process for depositing a gate for a transistor. The gate 250 of structure 400 can be patterned using resist and etching methods to form a gate as formed in structure 500. The gate 250 can be formed by depositing a layer of polysilicon, polysilicon/silicide, and/or suitable metal. Suitable metals include Ni, W, Ti, Co and silicides. Sidewall insulating spacers 255 can be formed using conventional processes.

Figure 5B:
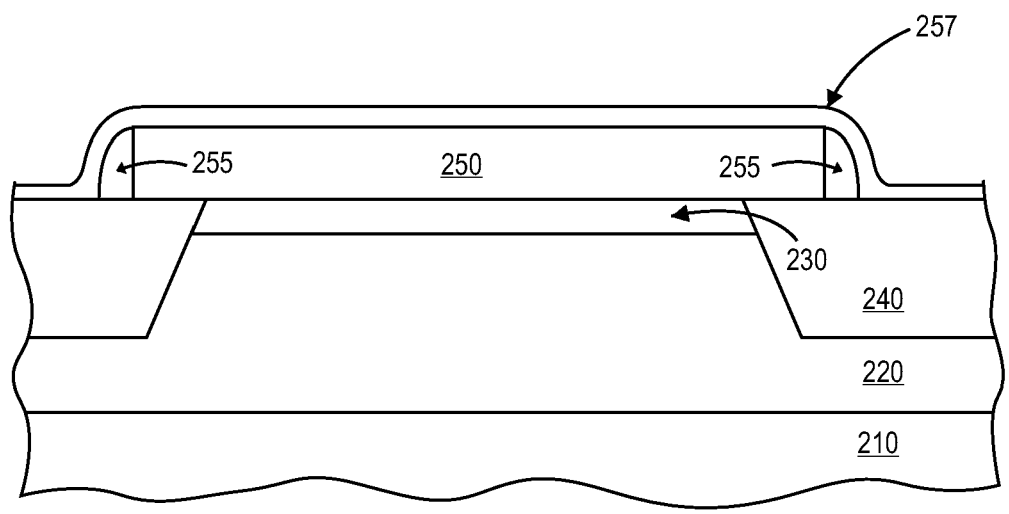
FIG. 5b illustrates a sample process for depositing a contact etch stop layer over the gate of a transistor.

FIG. 5b illustrates a sample process for depositing a contact etch stop layer over the gate of a transistor. The contact stop etch layer 257 can be deposited currently exposed structures on the surface of the wafer such as gate 250, spacers 255 and insulating structure 240. The contact stop etch layer 257 can be Ti, TiN, or a suitable material having a low resistivity. The stop layer can be subsequently used in conjunction with an etch having a selectivity of oxide-to-gate material of greater or equal to around 10:1. The contact stop etch layer 257 can be thinned using CMP such that the thickness of the layer is less than about one-fourth of the thickness of the transistor gate 250.

Figure 6:
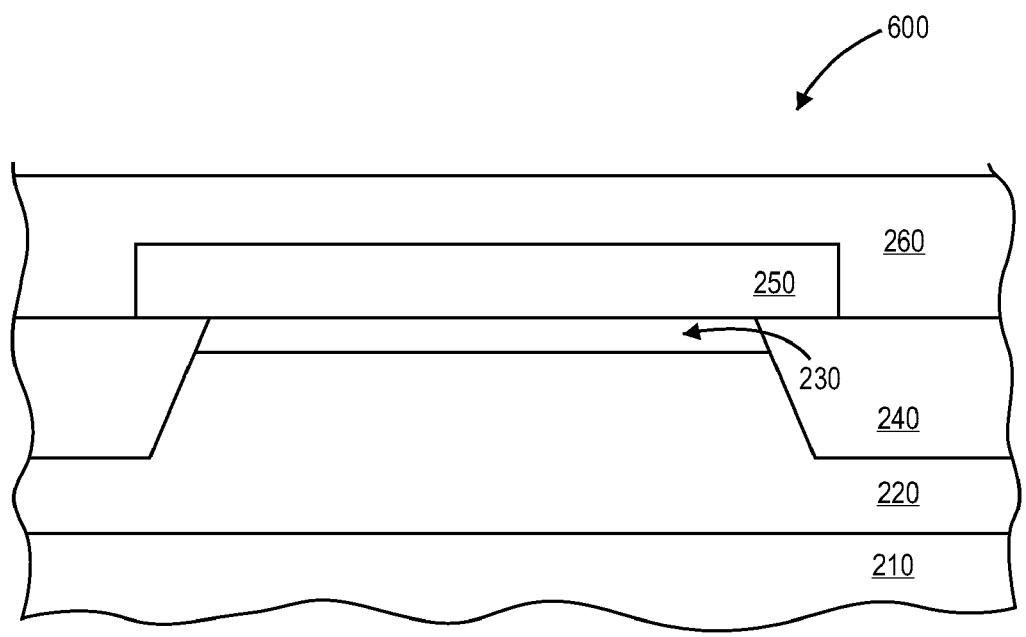
FIG. 6 illustrates a sample process for depositing and planarizing an insulation layer for a transistor.

FIG. 6 illustrates a sample process for depositing and planarizing an insulation layer for a transistor. Insulating layer 260 can include material such as BPSG, PSG, BSG, and the like. Insulating layer 260 can be planarized by using CMP, resist etch-back, or spun-on glass (SOG) to form structure 600.

Figure 7:
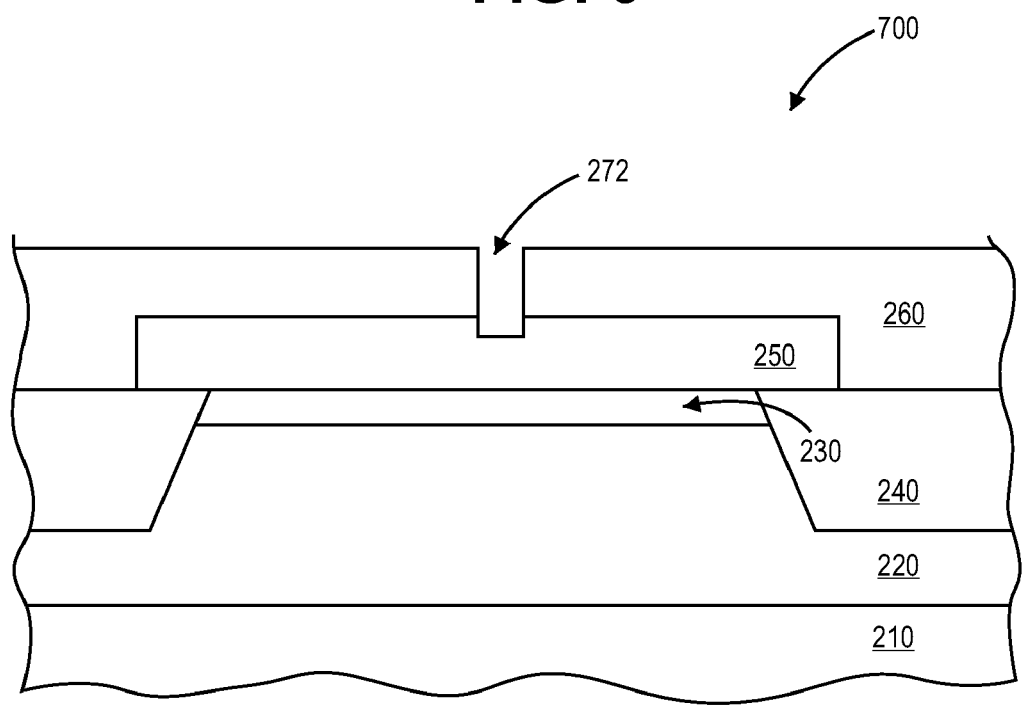
FIG. 7 illustrates a sample process for defining and etching a gate contact for a transistor.

FIG. 7 illustrates a sample process for defining and etching a gate contact for a transistor. Structure 700 includes a void 272 that is formed by etching insulating layer 260. A contact etch stop layer (such as TiN, and discussed above with respect to FIG. 5b) can be used to control the depth of the etching. The contact etching can be stopped at the gate surface or can be allowed to progress within the gate (but without "punching through" the underlying gate oxide, which would short out the active area or change operating characteristics of the transistor). The etching can be performed using an etch that has a selectivity of oxide-to-gate material of greater or equal to around 10:1.

Figure 8:
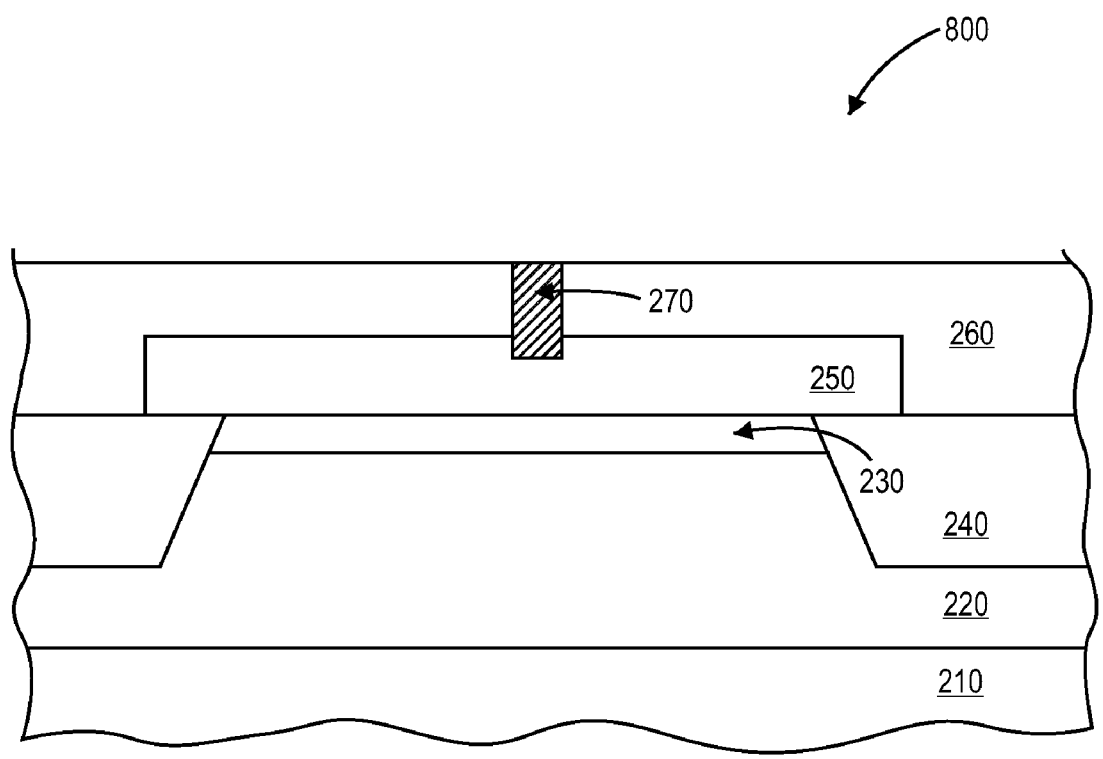
FIG. 8 illustrates a sample process for forming a gate contact for a transistor.

FIG. 8 illustrates a sample process for forming a gate contact for a transistor. Structure 800 can be formed by depositing a layer of metal over and within the voids etched with insulating layer 260. Suitable metals include Ti, TiN, W, Al, Cu, combinations thereof, and the like, and can be deposited as a stack such as a Ti/TiN/W metal stack, a Ti/TiN/Al metal stack, or a Ti/TiN/Cu metal stack. The deposited layer of metal can be planarized (by CMP, for example) to provide metal plugs 270.

Figure 9:
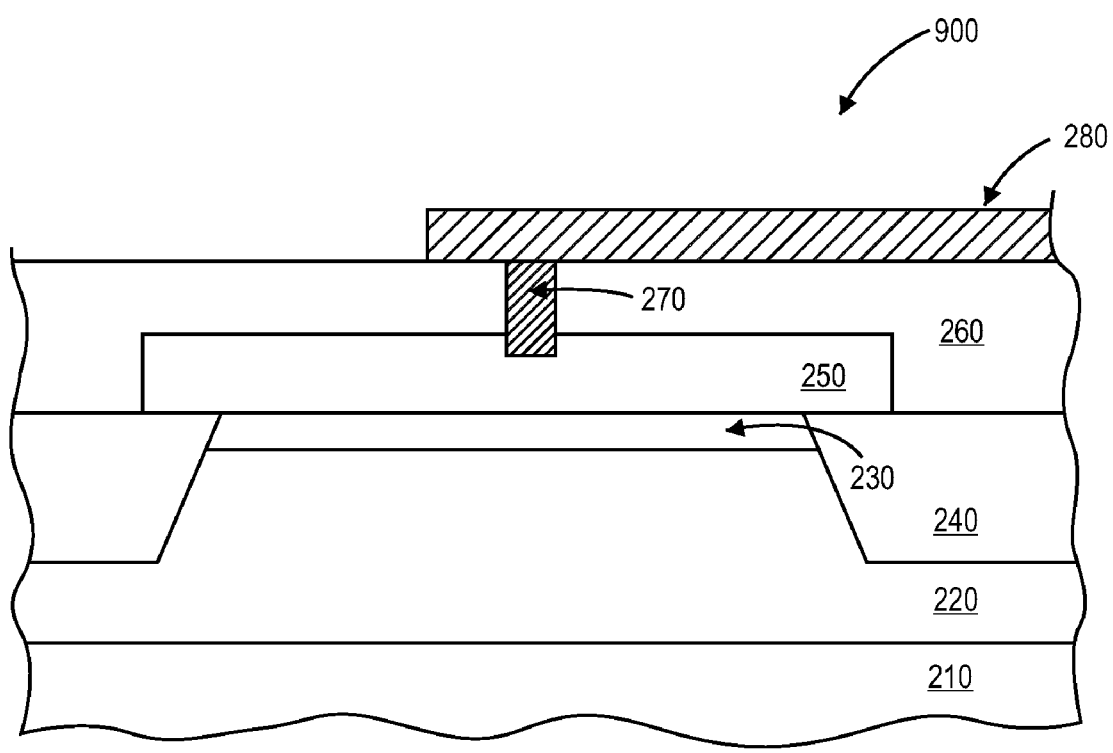
FIG. 9 illustrates a sample process for depositing a metalization layer for a gate contact for a transistor.

FIG. 9 illustrates a sample process for depositing a metalization layer for a gate contact for a transistor. Structure 900 can be formed by depositing a metal layer 280 across the exposed surface of the substrate as well as the upper surfaces of metal plugs 270. The deposited metal layer 280 can be patterned such that the metal plugs 270 can be selectively electrically connected with other devices and structures of the substrate.

Figure 10:
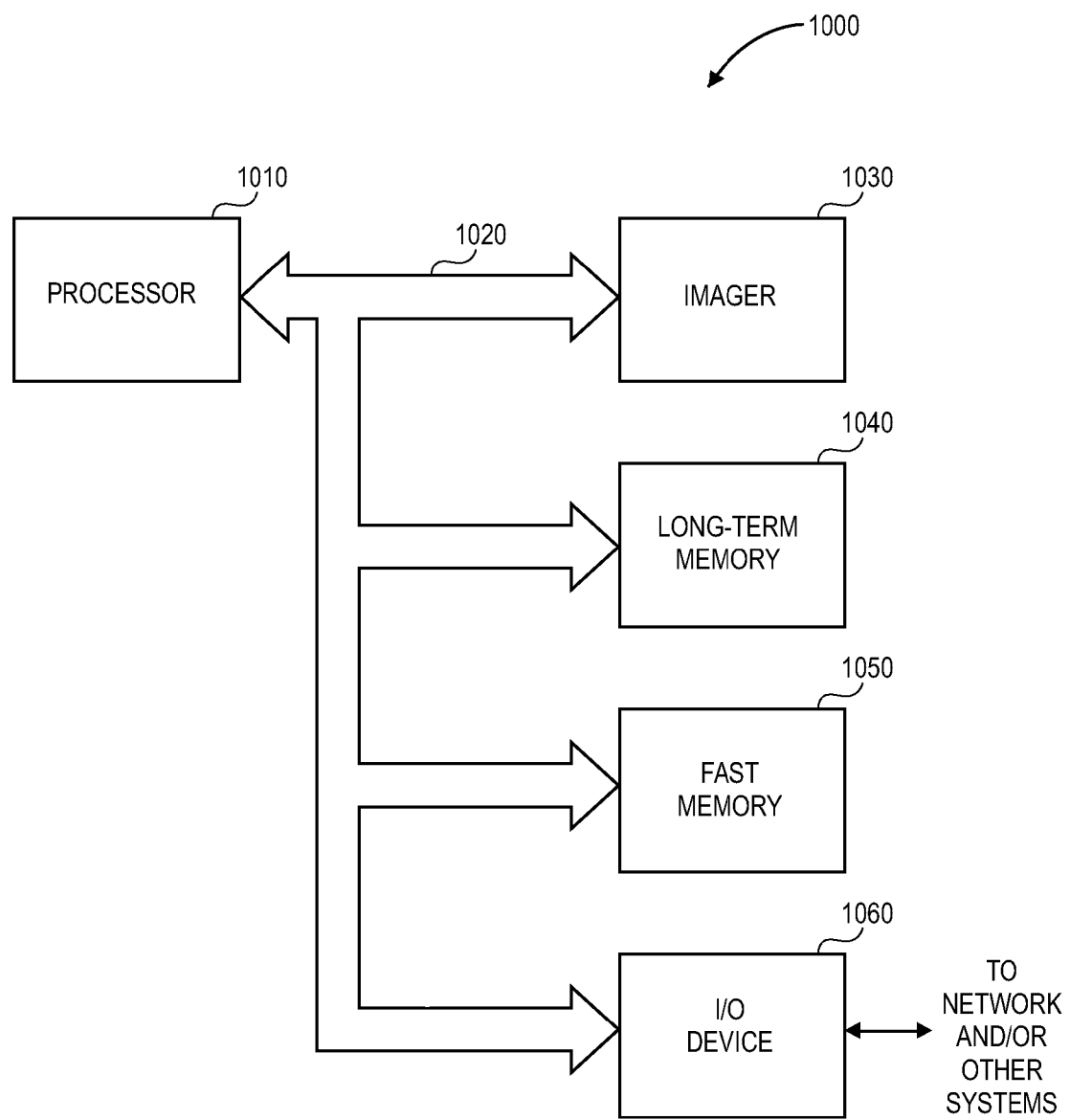
FIG. 10 illustrates a sample system that includes transistors having contacts formed over polysilicon gate active areas.

FIG. 10 illustrates a sample system that includes transistors having contacts formed over polysilicon gate active areas. System 1000 generally includes digital and/or analog circuits such as logic devices, CMOS imagers, CCD integers, and memory (including dram and NOR and/or NAND flash memory).

Components of system 1000 typically include a processor 1010 that communicates with various devices using a bus 1020. Transistors of processor 1010 (that have a reduced gate contact area) can operate more quickly because the reduced gate capacitance allows the transistors to switch more quickly. The greater density of smaller transistors in logic circuits can be used to provide additional logic functions in a given substrate area for increased processing power.

The various devices may include imager 1030, long-term memory 1040, fast memory 1050, and I/O device 1060. Imager 1030 may include CCD based or CMOS based photo transistors. The photo transistors can be more densely packed (and allow higher resolution imaging) because of the reduced area of the gate contact of the photo transistor.

Long-term memory devices 1040 typically include non-volatile memory such as magnetic media, PROMs, flash memory devices, compact discs, and the like. Long-term memory devices can be made smaller than conventional memory devices because of the reduced the area of the gate contact transistors of the devices.

Fast memory 1050 is typically based on SRAM or DRAM technology. The transistors of the memory cells of the SRAM or DRAM technology can be smaller (and faster) than conventional memory devices because of the reduced gate contact areas of transistors of the memory cells.

I/O device 1060 is typically used to allow communications between system 1000 and other systems and/or sensors. I/O. device 1060 can be a high speed serial interface in accordance with various networks. Transistors having a reduced gate contact area have faster transition times because of reduced gate capacitance.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An electrical circuit, comprising:
a transistor gate disposed over a substrate of an integrated circuit;
a gate insulator disposed between the transistor gate and the substrate of the integrated circuit, and wherein a portion of the gate insulator defines an active area for the transistor gate, wherein the active area is disposed between a source and a drain associated with the transistor gate;
an insulating layer disposed over the transistor gate;
a metal contact plug extending through a portion of the insulating layer directly over the active area, the metal contact plug contacting the transistor gate; and
an etch stopping layer disposed between the transistor gate and the insulating layer, wherein the etch stopping layer comprises Ti and is formed to a depth that is one-fourth a depth of the transistor gate.

2. The apparatus of claim 1, wherein the gate insulator is an oxide layer.

3. The apparatus of claim 1, further comprising a first isolation region and second isolation region disposed within the substrate such that the gate insulator lies between the first isolation region and the second isolation region.

4. The apparatus of claim 3, wherein the first isolation region and second isolation region are shallow trench isolation (STI) regions.

5. The apparatus of claim 1, wherein a portion of the substrate that lies beneath the gate insulator is doped with an N-type dopant.

6. The apparatus of claim 1, wherein the transistor gate consists essentially of polysilicon, polysilicon/silicide, or metal.

7. The apparatus of claim 6, wherein the silicide comprises Ni, W, Ti or Co.

8. The apparatus of claim 7, wherein the metal contact plug comprises a Ti/TiN/W metal stack, a Ti/TiN/Al metal stack, or a Ti/TiN/Cu metal stack.

9. An electrical device, comprising:
a transistor gate disposed within a substrate;
a gate insulator disposed beneath the transistor gate, and wherein a portion of the gate insulator defines an active area of the transistor gate, wherein the active area is disposed beneath the transistor gate and gate insulator and disposed between a source and a drain associated with the transistor gate;
a first isolation region and a second isolation region, each of which is disposed on opposing sides of the active area;
an insulating layer disposed above the transistor gate;
a metal contact plug extending vertically through a portion of the insulating layer that lies directly over the active area, the metal contact plug contacting the transistor gate; and
an etch stop layer at an interface between the transistor gate and the insulation layer, wherein the etch stop layer has an etch selectivity of oxide-to-gate material of greater or equal to around 10:1.

10. The apparatus of claim 9, wherein the device is a logic device, CMOS imager, CCD imager, or memory device.

11. The apparatus of claim 10, wherein the memory device is a DRAM, SRAM, or flash memory device.

12. The apparatus of claim 11, wherein the flash memory device is based on NOR-gate technology.

13. The apparatus of claim 9, further comprising a patterned metalization layer that is formed above the insulating layer and that is electrically coupled to an upper end of the metal contact plug.

* * * * *